United States Patent [19]
Stanchak et al.

[11] Patent Number: 5,168,464
[45] Date of Patent: Dec. 1, 1992

[54] NONVOLATILE DIFFERENTIAL MEMORY DEVICE AND METHOD

[75] Inventors: Carl M. Stanchak; Raymond A. Turi; James P. Yakura, all of Colorado Springs, Colo.

[73] Assignee: NCR Corporation, Dayton, Ohio

[21] Appl. No.: 442,809

[22] Filed: Nov. 29, 1989

[51] Int. Cl.[5] ............... G11C 7/00; G11C 11/407; G11C 29/00

[52] U.S. Cl. .................... 365/185; 365/189.09; 365/201

[58] Field of Search .......... 365/184, 185, 201, 189.09; 357/23.5; 307/296.1, 296.5, 296.8, 304

[56] References Cited

U.S. PATENT DOCUMENTS

| | | | |
|---|---|---|---|
| 4,404,475 | 9/1983 | Drori et al. | 365/185 X |
| 4,494,219 | 1/1985 | Tanaka et al. | 365/189.09 |
| 4,612,630 | 9/1986 | Rosier | 365/201 |
| 4,616,245 | 10/1986 | Topich et al. | 357/23.5 |
| 4,644,196 | 2/1987 | Flannagan | 365/190 |
| 4,658,380 | 4/1987 | Eby | 365/201 |
| 4,683,554 | 7/1987 | Lockwood et al. | 365/185 |
| 4,748,593 | 5/1988 | Topich et al. | 365/190 |
| 4,769,788 | 9/1988 | Poeppleman et al. | 365/185 |
| 4,780,750 | 10/1988 | Nolan et al. | 357/23.5 |
| 4,807,188 | 2/1989 | Casagrande | 365/182 |
| 4,841,482 | 6/1989 | Kreifels et al. | 365/185 |
| 4,875,188 | 10/1989 | Jungroth | 365/185 |

OTHER PUBLICATIONS

"A Million Cycle CMOS 256K EEPROM", D. Cioaca et al., IEEE Journal of Solid State Circuits; Oct. 5, 1987.

"Found; The Final Link to the One-Chip System", Electronics, Mar. 17, 1986.

*Primary Examiner*—Alyssa H. Bowler
*Attorney, Agent, or Firm*—Douglas S. Foote

[57] ABSTRACT

A nonvolatile memory device comprising first and second transistors connected between respective first and second terminals and a reference potential terminal, the transistors having first and second floating gates, respectively, for storing complementary charges. The device further comprises first and second input lines capacitively coupled to the gates, and means for providing a biasing voltage slightly in excess of the threshold voltage of the transistors to the input lines.

25 Claims, 1 Drawing Sheet

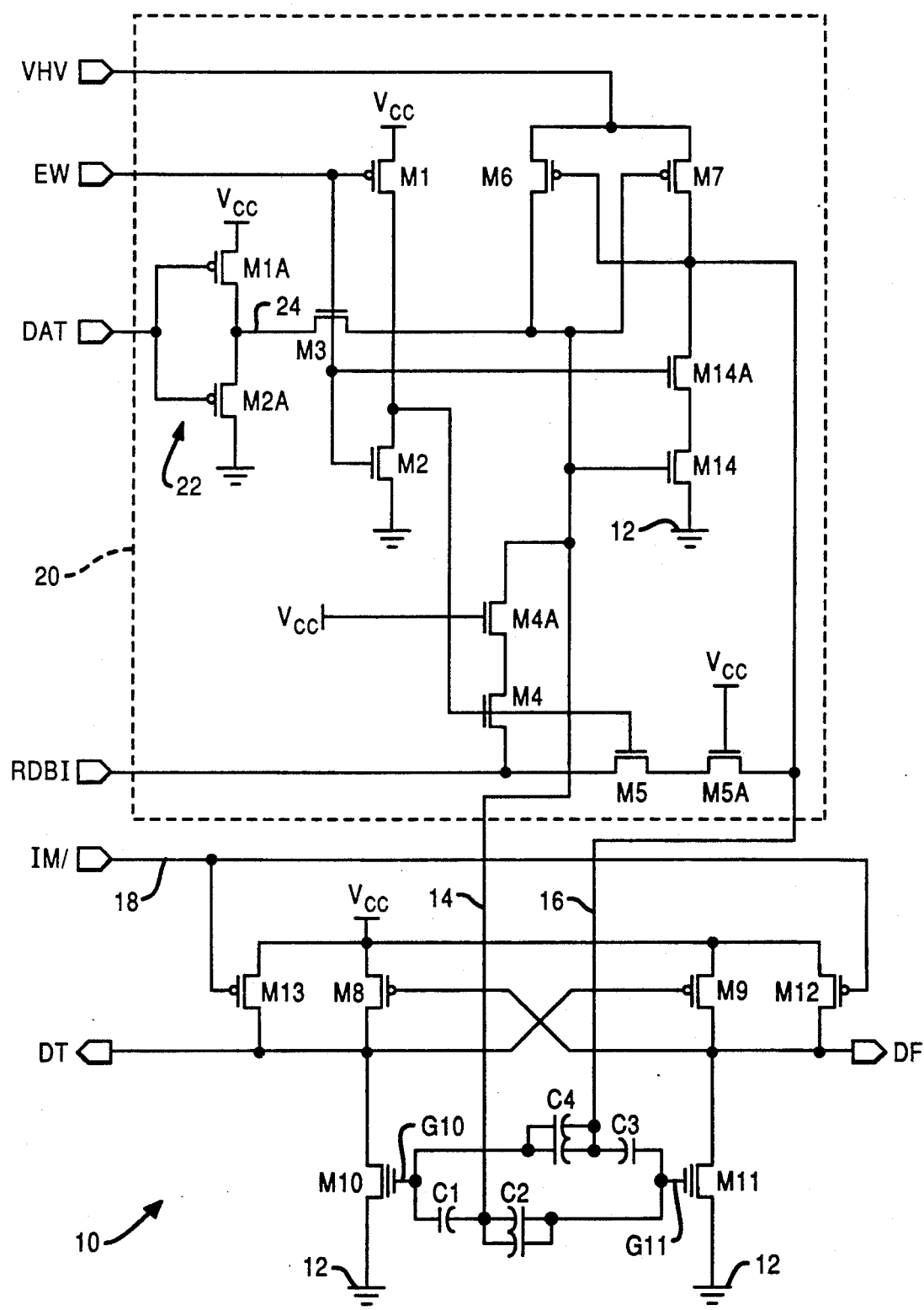

NONVOLATILE DIFFERENTIAL MEMORY DEVICE AND METHOD

The present invention relates to nonvolatile memory devices. More particularly, it relates to a cross-coupled, floating gate type electronically alterable read only memory (EAROM) and method.

BACKGROUND OF THE INVENTION

Semiconductor memory chips may be divided into volatile and nonvolatile types. Volatile memory devices are typified by random access memory (RAM) chips which require power in order to maintain data stored therein. In contrast, nonvolatile memory devices such as read only memory (ROM) chips maintain stored data after external power is removed. Data is readily changed in a RAM by a simple write operation. However, ROMs are programmed during manufacture and the stored data can not thereafter be changed.

A particular type of nonvolatile memory device which allows data to be altered is an electrically erasable programmable read only memory (EEPROM). An EEPROM cell is a transistor having a gate, drain and source. The gate is referred to as a "floating gate" since it is totally surrounded by an insulator so that it is not electrically connected to anything. The floating gate can be charged with electrons by capacitively coupling an electrode to the floating gate and applying a relatively large voltage to such electrode. Some electrons are able to cross the insulator in response to the applied voltage leaving a charge on the floating gate.

An improved nonvolatile memory cell is disclosed in U.S. Pat. No. 4,748,593 wherein a pair of transistors coupled to form single memory cell. The paired arrangement allows complementary charges to be stored on the corresponding floating gates which may be read with a differential sense amplifier. The complementary charges improve the long term retention of data as compared to maintaining a charge on a single floating gate.

A problem generally with nonvolatile memory cell design is the reliability of the cell. If the insulator surrounding the floating gate should develop a short, the gate will no longer be able to maintain a charge. If created during cell manufacture, such shorts can normally be detected by testing. However, cell failure that develops shortly thereafter (infant mortality) is more problematic. Related to reliability is the concept of "margining". Margining refers to the ability of a cell to function correctly beyond the nominal design values. For example, if the charge on a floating gate deviates from its prescribed value, will the cell yield the correct data value when read?

OBJECTS OF THE INVENTION

It is therefore an object of the present invention to provide a new and improved nonvolatile memory device.

It is another object of the present invention to provide a nonvolatile memory device with improved reliability.

It is a further object of the present invention to provide a nonvolatile memory device with improved testability for margining.

It is yet another object of the present invention to provide a new and improved method for storing and reading data in a nonvolatile memory device.

It is yet a further object of the present invention to provide a new and improved method for testing the margining capability of a nonvolatile memory device.

It is still another object of the present invention to provide a nonvolatile memory device which will continue to function despite a single thin oxide (insulator) failure.

SUMMARY OF THE INVENTION

One form of the present invention is a nonvolatile memory device comprising first and second transistors connected between respective first and second terminals and a reference potential terminal, the transistors having first and second floating gates, respectively, for storing complementary charges. The device further comprises first and second input lines capacitively coupled to the gates, and means for providing a biasing voltage slightly in excess of the threshold voltage of the transistors to the input lines.

Another form of the invention is a method for using the above described memory device which includes storing complementary charges on the floating gates, and providing a biasing voltage slightly in excess of the threshold voltage of the transistors to the input lines.

Another form of the present invention is a method for testing the margining capability of the memory device. The memory device further has third and fourth transistors connected between a power supply terminal and the first and second terminals, respectively, and fifth and sixth transistors connected in parallel to the third and fourth transistors, respectively. In addition, the control electrode of the third transistor is connected to the second terminal and the control electrode of the fourth transistor is connected to the first terminal. The method includes providing a margining signal to the control electrode of the fifth and sixth transistors, and reading the voltages on the first and second terminals to test the operation of the memory device.

The margining capability of the device may be further tested by providing substantially equal voltages on the first and second lines to increase the relative potential of the stored charges, and reading the voltage on the first or second terminal to test the operation of the memory device.

BRIEF DESCRIPTION OF THE DRAWINGS

The FIGURE is a circuit diagram of a nonvolatile memory device according to one form of the present invention.

DESCRIPTION OF A PREFERRED EMBODIMENT

The FIGURE shows a memory device 10 including NMOS field effect transistors M10 and M11. Transistor M10 is connected between an output terminal DT (data true) and a reference potential terminal 12 which in a preferred embodiment is ground. Transistor M10 is a three terminal device with source, drain and floating gate G10 electrodes. Its drain is connected to terminal DT and its source to terminal 12. Transistor M11 is connected between an output terminal DF (data false) and a reference potential terminal 12. Transistor M11 is a three terminal device with source, drain and floating gate G11 electrodes. Its drain is connected to terminal DF and its source to terminal 12. As will be described more fully hereinafter, floating gates G10 and G11 store nonvolatile, complementary (high and low) charges. Memory device 10 also includes input lines 14 and 16 which are capacitively coupled to floating gates G10 and G11. Input line 14 is capacitively coupled to floating gate G10 by a relatively small thin oxide capacitor C1 and to floating gate G11 by a relatively large thin oxide capacitor C2. Similarly, input line 16 is capacitively coupled to floating gate G11 by a relatively small thin oxide capacitor C3 and to floating gate G10 by a relatively large thin oxide capacitor C4. In a preferred embodiment, the ratio of capacitances of C2 to C1 and C4 to C3 will be about 9:1.

Device 10 also includes a differential sense amplifier with PMOS field effect transistors M8 and M9. Transistor M8 is connected between a power supply terminal VCC and terminal DT. Transistor M9 is connected between power supply terminal VCC and terminal DF. The control electrode or gate of transistor M8 is connected to terminal DF, and the control electrode or gate of transistor M9 is connected to terminal DT.

Transistors M13 and M12 are provided for margin testing, as will be described more fully later. Transistor M13 is a PMOS field effect transistor connected in parallel with transistor M8 between power supply terminal VCC and terminal DT. Transistor M12 is also a PMOS field effect transistor which is connected in parallel with transistor M9 between power supply terminal VCC and terminal DF. The control electrode or gate of each of transistors M13 and M12 is connected to a control line 18 for receiving an active low margining signal IM/.

Memory device 10 also includes a control circuit 20 for providing and connecting various charging, biasing, and margining voltages to input lines 14 and 16 as will be described more fully later. Control circuit 20 receives VHV (high voltage), EW (enable write), DAT (data), and RDBI (read bias) input signals and provides output signals on lines 14 and 16. In a preferred embodiment, the VHV provides low and high voltages of about 0.9 and 15 volts, respectively, and the RDBI provides a low voltage of about 0.9 volts. For margin testing, VHV and RDBI can also be provided with other voltages in excess of 0.9 volts, as will be discussed later. Data to be written into memory device 10 is received as the DAT signal and inverted by CMOS inverter 22. The inverted value is provided to node 24. Node 24 is connected to line 14 through transistor M3. The programming voltage signal VHV is connected to line 14 through PMOS transistor M6 and to line 16 through PMOS transistor M7. Line 16 is connected to reference potential terminal 12 through NMOS transistors M14A and M14. The read bias signal RDBI is connected to line 16 through NMOS transistors M5 and M5A, and is connected to line 14 through NMOS transistors M4 and M4A. The write enable signal EW is inverted by the CMOS inverter consisting of PMOS transistor M1 and NMOS transistor M2 and the inverted signal provided to the control electrode of transistors M4 and M5. The EW signal is also provided to the control electrode of transistors M3, M2 and M14A. Line 16 is connected to the control electrode of transistor M6. Line 14 is connected to the control electrode of transistors M7 and M14. The control electrodes of transistors M4A and M5A are connected to power supply terminal VCC.

In order to store a charge in memory device 10, the data to be stored is provided as the DAT signal, the write enable signal EW is active high and the programming voltage VHV is at its high value, preferably about 15 volts. If a data value "1" is to be written to device 10, inverter 22 provides a "0" (ground potential) to node 24. Transistor M3 is turned on by the EW signal which allows transistor M7 to be turned on. This connects the 15 volt VHV signal to line 16 while 0 volts are provided to line 14. Floating gates G10 and G11 are now charged as the current through capacitor C3, a thin oxide tunneling device, builds a positive charge on gate G11, and the current through capacitor C1, a thin oxide tunneling device, builds a negative charge gate G10. The charge developed on floating gate G11 will exceed the threshold voltage of transistor M11 and be effective to drive transistor M11 into saturation. In contrast, the charge developed on floating gate G10 will be less than the threshold voltage of transistor M10 and be effective to prevent transistor M10 from conducting. In a similar fashion, a "0" data value to be written to device 10 is provided to node 24 as a "1" (the VCC potential), which in a preferred embodiment in about 5 volts. Transistor M7 is off, but transistors M14 and M14A are turned on by the signal on node 24 and the EW signal, respectively. This provides ground potential to line 16 and also to the gate of transistor M6 which connects the 15 volts of the VHV signal to line 14. Gates G10 and G11 will charge to positive and negative values through capacitors C1 and C3 respectively.

After data is stored in device 10, the EW signal goes low and the programming voltage drops to the same voltage as RDBI, which has a value slightly in excess of the threshold voltage of transistors M10 and M11. In a preferred embodiment this is about 0.9 volts. This read bias signal (RDBI) is provided to line 16 through transistors M5 and M5A and to line 14 through transistors M4 and M4A. The assertion of VHV to the same potential as RDBI prevents current from flowing through M6 and M7. If the floating gates G10 and G11 have not developed a short across C1 or C3, the thin oxide tunneling devices, one of transistors M10 or M11 will be on and the other off. Assuming transistor M11 is "on" and transistor M10 is "off" then the DF output terminal will be pulled low to ground 12. This will also turn on transistor M8 which will connect VCC to output terminal DT. Similarly, assuming transistor M10 is "on" and transistor M11 is "off" then the DT output terminal will be pulled to ground 12. This will also turn on transistor M9 which will connect VCC to output terminal DF. In operation, only one of the output terminals DF or DT will normally be used; however, either one will provide a well defined signal.

The present invention has particular utility when one of the capacitors C1, C2, C3 or C4 develops a short in its thin oxide so that the respective floating gate G10 or G11 can not hold a charge. Assume first that the complementary charging of gates G10 and G11 charges gate G11 to a positive value, but gate G11 develops a short and can not hold the charge. Since input line 16 has a read bias voltage of 0.9 volts which is slightly above the threshold voltage of transistor G11, transistor G11 will start to pull terminal DF to ground potential 12. This will turn on transistor M8 bringing terminal DT to VCC, and the DT and DF terminals will provide the correct output signals. Next assume gate G10 is charged high, gate G11 is charged low but G11 develops a short. Transistor M11 will start to conduct as a result of the 0.9 RDBI voltage applied to its gate G11. However, transistor M10 will be driven into saturation by the high voltage (much greater than 0.9 volts) on its gate G10, pulling terminal DT low which will turn on transistor M9 hard. Current will flow from VCC to ground through transistors M9 and M11. However, since transistor M9 is saturated and transistor M11 is operating in its ohmic region, most of the voltage drop will occur across transistor M11 thereby keeping output DF near the high value of VCC. This will be high enough to keep transistor M8 off. Again, the DT and DF terminals will provide correct output signals.

In order to test the margin of a "0" state at the DT or DF terminal, an active low IM/ signal is provided to the control electrode of transistors M13 and M12. In a preferred embodiment, the high and low values of the IM/ signal are about 5 and 2 volts, respectively. When an active low IM/ signal of 2 volts is applied to the control electrode of transistors M13 and M12, each transistor begins to conduct. Assuming a "0" state at the DF terminal is to be tested, transistor M11 would be conducting so as to pull the DF terminal to ground. As current is conducted from terminal VCC to the DF terminal through transistor M12, transistor M11 should be able to sink some of the additional current. The voltage measured at terminal DF will reflect the current sinking capability of transistor M12 which in turn reflects the strength of the charge on floating gate G11. It will be appreciated that the actual voltage at the DF terminal will not normally be measured in practice. Rather, since output terminal DF is typically connected to one or more series connected inverters, the ability of the DF terminal to remain below the threshold voltage of the following inverters will be reflected in the output state of a selected inverter. In a similar manner, the "0" state at the DT terminal can be margined by observing the output of a selected downstream inverter when an active low IM/ signal is provide to line 18.

In order to test the margin of a "1" state at the DT or DF terminal, the IM/ signal is returned to its inactive high state of about 5 volts. This turns off transistors M13 and M12. The read bias input signal RDBI and the high voltage signal VHV are increased from their biasing value and maintained at substantially the same intermediate voltage. In a preferred embodiment this will mean raising the RDBI and VHV voltages from about 0.9 volts to about 3 volts. This provides 3 volts to input lines 14 and 16 which are now equalized through control circuit 20 (assuming EW is low). By raising the potential on both sides of the now parallel coupling capacitors C1-C4, the relative potential of the floating gates is increased by about the same amount. In practice, raising the potential of lines 14 and 16 from 0.9 to 3 volts will raise the relative potential of gate G10 and G11 by about 2 volts. Assuming a "1" state at the DF terminal is to be tested, transistor M11 would be off and transistor M9 conducting so as to pull up the DF terminal to the potential of VCC. If the negative charge on floating gate G11 was sufficient when set, an increase of about 2 volts should not drive transistor M11 into a conductive state whereby the voltage at the DF terminal falls below a predetermined threshold value. The determination of whether the voltage at the DF terminal does not exceed this threshold is again made by reading the voltage on the DF terminal or, equivalently, by sampling the output of one of the inverters connected to the output. In a similar manner, the "1" state at the DT terminal can be margined.

It will be clear to those skilled in the art that the present invention is not limited to the specific embodiment disclosed and illustrated herein. Numerous modifications, variations, and full and partial equivalents can be undertaken without departing from the invention as limited only by the spirit and scope of the appended claims.

What is desired to be secured by Letters Patent of the United States is as follows.

What is claimed is:

1. A nonvolatile memory device comprising:
   first and second transistors connected between respective first and second terminals and a reference potential terminal, said transistors having first and second floating gates, respectively, for storing complementary charges;
   first and second input lines capacitively coupled to said gates; and
   means for providing a biasing voltage slightly in excess of the threshold voltage of said transistors to said input lines.

2. The device of claim 1 wherein said providing means includes a biasing voltage coupled to said input line by a control circuit.

3. The device of claim 1 wherein a first of said complementary charges is effective for driving its transistor into saturation and the other of said charges is effective for preventing its transistor from conducting.

4. The device of claim 1 further comprising:
   means for charging said first and second gates with said complementary charges.

5. The device of claim 4 wherein said charging means includes said first and second input lines.

6. The device of claim 5 wherein said charging means further includes relatively small thin oxide capacitors connected between said first input line and first gate and second input line and second gate, respectively, and relatively large thin oxide capacitors connected between said first input line and second gate and second input line and first gate, respectively.

7. The device of claim 6 wherein said charging means further includes high voltage and low voltage sources and means for switching said sources between said first and second lines for charging said device in response to a data signal to be stored in said device.

8. The device of claim 1 further comprising:
   third and fourth transistors connected between a power supply terminal and said first and second terminals, respectively.

9. The device of claim 8 wherein the control electrode of said third transistor is connected to said second terminal and the control electrode of said fourth transistor is connected to said first terminal.

10. The device of claim 8 wherein said first and second transistors are of a first conductivity type and said third and fourth transistors are of a second conductivity type.

11. The device of claim 10 wherein said first and second transistors are NMOS field effect transistors and said third and fourth transistors are PMOS field effect transistors.

12. The device of claim 1 wherein said first and second transistors are of the same conductivity type.

13. The device of claim 12 wherein said first and second transistors are NMOS field effect transistors.

14. The device of claim 8 further comprising:
   fifth and sixth transistors connected in parallel to said third and fourth transistors, respectively.

15. The device of claim 14 wherein each of said fifth and sixth transistors has a control electrode for receiving a margining signal.

16. The device of claim 15 wherein said fifth and sixth transistors are PMOS field effect transistors.

17. The device of claim 8 further comprising:
means for increasing but maintaining substantially equal voltages on said first and second lines.

18. A nonvolatile memory device comprising:
first and second transistors connected between respective first and second terminals and a reference potential terminal, said transistors having first and second floating gates, respectively, for storing complementary charges, wherein a first of said complementary charges is effective for driving its transistor into saturation and the other of said charges is effective for preventing its transistor from conducting;
third and fourth transistors connected between a power supply terminal and said first and second terminals, respectively, wherein the control electrode of said third transistor is connected to said second terminal and the control electrode of said fourth transistor is connected to said first terminal;
first and second input lines capacitively coupled to said floating gates; and
means for providing a biasing voltage slightly in excess of the threshold voltage of said first and second transistors to said input lines;
wherein said first and second transistors are of a first conductivity type and said third and fourth transistors are of a second conductivity type.

19. The device of claim 18 further comprising:
means for charging said first and second gates with said complementary charges;
wherein said charging means includes:
said first and second input lines;
relatively small thin oxide capacitors connected between said first input line and first gate and second input line and second gate, respectively, and relatively large thin oxide capacitors connected between said first input line and second gate and second input line and first gate, respectively; and
high voltage and low voltage sources and means for switching said sources between said first and second lines for charging said device in response to a data signal to be stored in said device.

20. The device of claim 19 further comprising:
fifth and sixth transistors connected in parallel to said third and fourth transistors, respectively, wherein each of said fifth and sixth transistors has a control electrode for receiving a margining signal; and
means for increasing but maintaining substantially equal voltages on said first and second lines.

21. The device of claim 20 wherein said first and second transistors are NMOS field effect transistors, said third and fourth transistors are PMOS field effect transistors, and said fifth and sixth transistors are PMOS field effect transistors.

22. In a nonvolatile memory device having first and second transistors connected between respective first and second terminals and a reference potential terminal, said transistors having first and second floating gates, respectively, and first and second input lines capacitively coupled to said gates, the method comprising:
storing complementary charges on said gates; and
providing a biasing voltage slightly in excess of the threshold voltage of said transistors to said first and second input lines.

23. The method of claim 22 wherein said storing step includes:
providing differential charging voltages to said first and second lines, respectively.

24. In a nonvolatile memory device having first and second transistors connected between respective first and second terminals and a reference potential terminal, said transistors having first and second floating gates, respectively, and first and second input lines capacitively coupled to said gates, said memory device further having third and fourth transistors connected between a power supply terminal and said first and second terminals, respectively, and fifth and sixth transistors connected in parallel to said third and fourth transistors, respectively, wherein the control electrode of said third transistor is connected to said second terminal and the control electrode of said fourth transistor is connected to said first terminal, the method comprising:
storing complementary charges on said gates;
providing a margining signal to the control electrode of said fifth and sixth transistors; and
reading the voltages on said first or second terminal to test the operation of said memory device.

25. In a nonvolatile memory device having first and second transistors connected between respective first and second terminals and a reference potential terminal, said transistors having first and second floating gates, respectively, and first and second input lines capacitively coupled to said gates, said memory device further having third and fourth transistors connected between a power supply terminal and said first and second terminals, respectively, and fifth and sixth transistors connected in parallel to said third and fourth transistors, respectively, wherein the control electrode of said third transistor is connected to said second terminal and the control electrode of said fourth transistor is connected to said first terminal, the method comprising:
storing complementary charges on said gates;
providing substantially equal voltages on said first and second input lines to increase the relative potential of said stored charges; and
reading the voltage on said first or second terminal to test the operation of said memory device.

* * * * *